(12) United States Patent
Afsahi

(10) Patent No.: US 9,130,660 B2
(45) Date of Patent: Sep. 8, 2015

(54) MULTIPLE-PATH NOISE CANCELLATION

(71) Applicant: Broadcom Corporation, Irvine, CA (US)

(72) Inventor: Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/200,720

(22) Filed: Mar. 7, 2014

(65) Prior Publication Data

US 2015/0195002 A1     Jul. 9, 2015

Related U.S. Application Data

(60) Provisional application No. 61/924,890, filed on Jan. 8, 2014.

(51) Int. Cl.
*H04B 1/00* (2006.01)
*H04B 1/62* (2006.01)
*H04B 1/04* (2006.01)

(52) U.S. Cl.
CPC ............. *H04B 1/62* (2013.01); *H04B 1/0483* (2013.01); *H04B 2001/0425* (2013.01)

(58) Field of Classification Search
CPC ............. H04B 1/0475; H04B 1/0483; H04B 2001/0425; H04B 2001/0441; H04B 1/62

USPC ........... 455/24, 63.1, 91, 114.1, 114.2, 114.3, 455/126, 127.3; 330/149, 151, 152; 375/296, 297
See application file for complete search history.

(56) References Cited

U.S. PATENT DOCUMENTS

| | | | | |
|---|---|---|---|---|
| 5,610,554 A | * | 3/1997 | Anvari | 330/52 |
| 5,742,201 A | * | 4/1998 | Eisenberg et al. | 330/2 |
| 5,760,646 A | * | 6/1998 | Belcher et al. | 330/149 |

* cited by examiner

*Primary Examiner* — Tuan Pham
(74) *Attorney, Agent, or Firm* — Brinks Gilson & Lione

(57) ABSTRACT

A communication device, such as a smartphone or tablet, includes a communication interface with noise cancellation logic. The noise cancellation logic includes a lead path and a reference path. A signal source provides a signal to the lead path and the references path. The signal is amplified along the lead path and the reference path. Distortion is imparted onto the signal during amplification on the lead path. A correction signal based on the difference between the amplified signal on the lead path and the amplified signal on the reference path is generated by the noise cancellation logic. The correction signal may reflect to distortion imparted during amplification on the lead path. The correction signal is differentially combined with the amplified signal on the lead path to attempt to remove the distortion and generate an output.

20 Claims, 9 Drawing Sheets

MULTIPLE-PATH NOISE CANCELLATION

PRIORITY CLAIM

This application claims priority to U.S. Provisional Application Ser. No. 61/924,890 filed Jan. 8, 2014, which is incorporated herein by reference in its entirety.

TECHNICAL FIELD

This disclosure relates to signal transmission. This disclosure also relates to noise cancellation in technologies such as cellular telephones and other devices.

BACKGROUND

Rapid advances in electronics and communication technologies, driven by immense customer demand, have resulted in the widespread adoption of mobile communication devices. The extent of the proliferation of such devices is readily apparent in view of some estimates that put the number of wireless subscriber connections in use around the world at over 85% of the world's population. Furthermore, past estimates have indicated that (as just three examples) the United States, Italy, and the UK have more mobile phones in use in each country than there are people even living in those countries. Improvements in wireless communication devices, particularly in their robustness to noise, will help continue to make such devices attractive options for the consumer.

DETAILED DESCRIPTION

Figure 1:
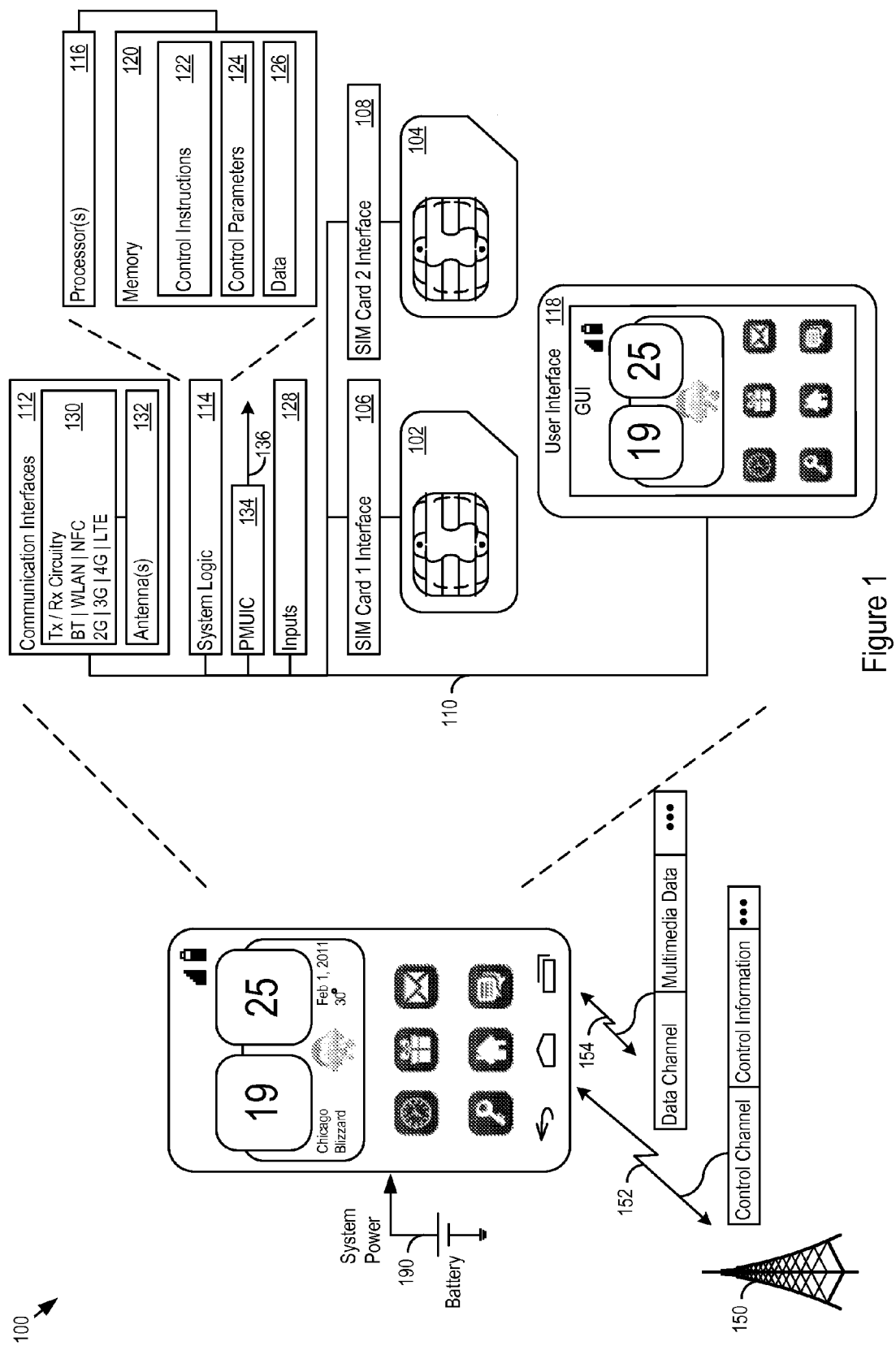
FIG. 1 shows an example of user equipment.

FIG. 1 shows an example of user equipment 100 ("UE 100"). The UE 100 is a smartphone in this example, but the UE may be any electronic device. The techniques described below regarding noise cancellation techniques may be implemented in virtually any communications device. Accordingly, the smartphone example described below provides just one example context for explaining the noise cancellation techniques discussed below. Further, the noise and interference cancellation techniques and architectures are discussed in primarily terms of canceling distortion from an amplifier. Amplifier distortion is just one example among other types of interference that the noise cancellation techniques and architectures may address.

As one example, UE may be a 2G, 3G, or 4G/LTE cellular phone capable of making and receiving wireless phone calls, and transmitting and receiving data using 802.11 a/b/g/n/ac/ad ("WiFi"), Bluetooth (BT), Near Field Communications (NFC), or any other type of wireless technology. The UE may also be a smartphone that, in addition to making and receiving phone calls, runs any number or type of applications. UE may, however, be virtually any device that transmits and receives information, including as additional examples a driver assistance module in a vehicle, an emergency transponder, a pager, a satellite television receiver, a networked stereo receiver, a computer system, music player, or virtually any other device. The isolation circuits discussed below may also be implemented in other devices, such as a base station or other network controller that communicates with the UE.

FIG. 1 shows an example of the UE 100 in communication with a network controller 150, such as an enhanced Node B (eNB) or other base station. The network controller 150 and UE 100 establish communication channels such as the control channel 152 and the data channel 154, and exchange data. In this example, the UE 100 supports one or more Subscriber Identity Modules (SIMs), such as the SIM1 102 and the SIM2 104. Electrical and physical interfaces 106 and 108 connect SIM1 102 and SIM2 104 to the rest of the user equipment hardware, for example, through the system bus 110.

The UE 100 includes communication interfaces 112, system logic 114, and a user interface 118. The system logic 114 may include any combination of hardware, software, firmware, or other logic. The system logic 114 may be implemented, for example, with one or more systems on a chip (SoC), application specific integrated circuits (ASIC), discrete analog and digital circuits, and other circuitry. The system logic 114 is part of the implementation of any desired functionality in the UE 100. In that regard, the system logic 114 may include logic that facilitates, as examples, decoding and playing music and video, e.g., MP3, MP4, MPEG, AVI, FLAG, AC3, or WAV decoding and playback; running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 and the inputs 128 may include a graphical user interface, touch sensitive display, voice or facial recognition inputs, buttons, switches, speakers and other user interface elements. Additional examples of the inputs 128 include microphones, video and still image cameras, temperature sensors, vibration sensors, rotation and orientation sensors, headset and microphone input/output jacks, Universal Serial Bus (USB) connectors, memory card slots, radiation sensors (e.g., IR sensors), and other types of inputs.

The system logic 114 may include one or more processors 116 and memories 120. The memory 120 stores, for example, control instructions 122 that the processor 116 executes to carry out desired functionality for the UE 100. The control parameters 124 provide and specify configuration and operating options for the control instructions 122. The memory 120 may also store any BT, WiFi, 3G, or other data 126 that the UE 100 will send, or has received, through the communication interfaces 112. The UE 100 may include a power management unit integrated circuit (PMUIC) 134. In a complex device like a smartphone, the PMUIC 134 may be responsible for generating as many as thirty (30) different power supply rails 136 for the circuitry in the UE 100. The PMUIC 134 may generate one or many power supply rails for the UE 100 from the system power source 190, which may include a battery or other power source.

In the communication interfaces 112, Radio Frequency (RF) transmit (Tx) and receive (Rx) circuitry 130 handles transmission and reception of signals through one or more antennas 132. The communication interface 112 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium.

The transmitted and received signals may adhere to any of a diverse array of formats, protocols, modulations (e.g., QPSK, 16-QAM, 64-QAM, or 256-QAM), frequency channels, bit rates, and encodings. As one specific example, the communication interfaces 112 may include transceivers that support transmission and reception under the 2G, 3G, BT, WiFi, and 4G/Long Term Evolution (LTE) standards. The techniques described below, however, are applicable to other wireless communications technologies whether arising from the 3rd Generation Partnership Project (3GPP), GSM (R) Association, Universal Mobile Telecommunications System (UMTS), High Speed Packet Access (HSPA)+, or other partnerships or standards bodies.

Figure 2:
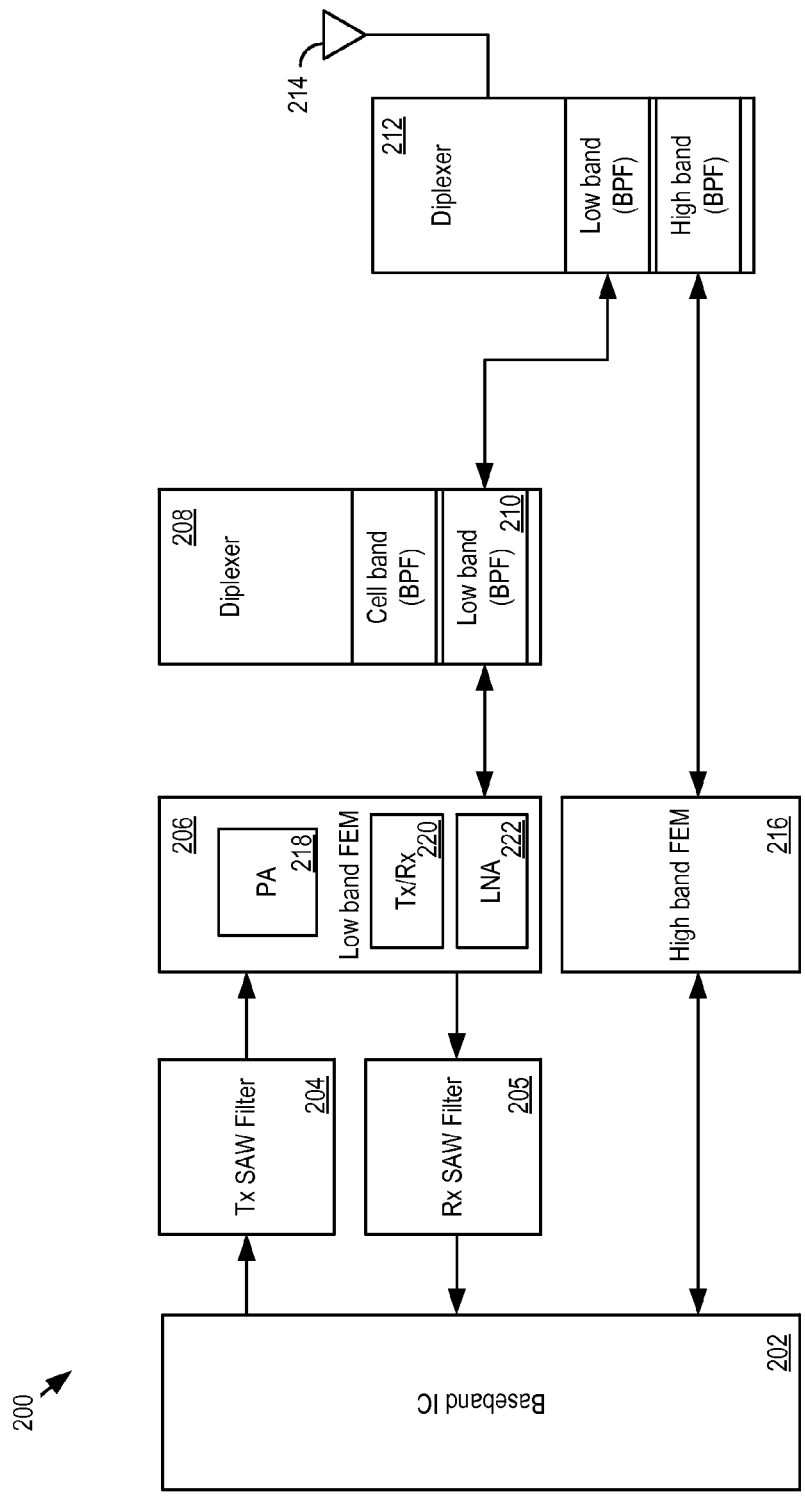
FIG. 2 shows example logic for noise filtering.

FIG. 2 shows example logic 200 for noise filtering. The logic 200 may include a baseband integrated circuit (IC) 202, which may support a wireless protocol such as one of those discussed above. For example, the baseband IC 202 may support a Wi-Fi connection at 2.412 GHz. For Tx, the output of the baseband IC may be filtered by a surface acoustic wave (SAW) filter 204 which may have high rejection at the operational frequency of a second wireless protocol supported by the device, e.g., a 2.4 GHz LTE band. The SAW filter 204 may filter noise at the operational frequency out of the system.

In some implementations, it may be challenging to incorporate a SAW filter into the baseband IC 202. For example, it may be challenging to fabricate a SAW filter using an integrated commentary metal oxide semiconductor (CMOS) fabrication technique used to fabricate the baseband IC 202. Thus, instead, various implementations may include, a discrete SAW filter component external to the baseband IC 202.

The output of the SAW filter 204 may be provided to a frontend module (FEM) 206. The FEM 206 may include a power amplifier (PA) 218 and a Tx/Rx switch 220. The PA 218 within the FEM 206 may impart distortion onto the transmission signal. The output of the FEM 206 may be provided to a diplexer 208 including a bandpass filter 210 to remove distortion imparted by the PA 218.

The output of the diplexer 208 may be provided to a second diplexer 212 for sharing the antenna 214 with a protocol operating at a second frequency band, e.g. WiFi at 5 GHz. The protocol at the second frequency band may be supported by a second FEM 216. For receive (Rx) operation, the output of the antenna 214 is provided to the FEM 206 via the diplexer 208. The FEM 206 may further include a low noise amplifier (LNA) 222 for Rx operation. The LNA may impart distortion onto the received signal. The receive SAW filter 205 may help to remove distortion from the LNA 222 prior to provision of the received signal to the baseband IC 202.

In some cases, integrated components, e.g. integrated to form a SoC, integrated into the baseband IC 202, or other integration scheme, may offer reduced power consumption and reduced manufacturing costs. Various integrated components, such as power amplifiers and filters with arbitrary pass profiles, may present challenges in device design. For example, an integrated power amplifier (iPA) may produce higher levels of distortion that a discrete power amplifier (dPA) component. In some cases, the distortion levels contributed by the iPA may be 5-10 dB greater than that contributed by the dPA. Noise cancellation designs may have the potential to improve the performance on dPA systems and/or allow iPA systems to better match the noise and interference performance of dPA systems. Additionally or alternatively, cancellation designs may relax filtering requirements of iPA and dPA systems. The noise and interference cancellation techniques and architectures described below may be implemented in dPA and iPA systems.

In some implementations, the noise performance of the system as a whole, e.g. an iPA or dPA systems, may have a larger effect on operation than the noise performance of an individual component of the system. In some cases, an iPA may be implemented in a system with standards-compliant (e.g. LTE, WCDMA, TS-CDMA, or other wireless standards) noise performance specifications. For example, an integrated system may implement noise mitigation techniques compatible with the integrated architecture.

Figure 3:
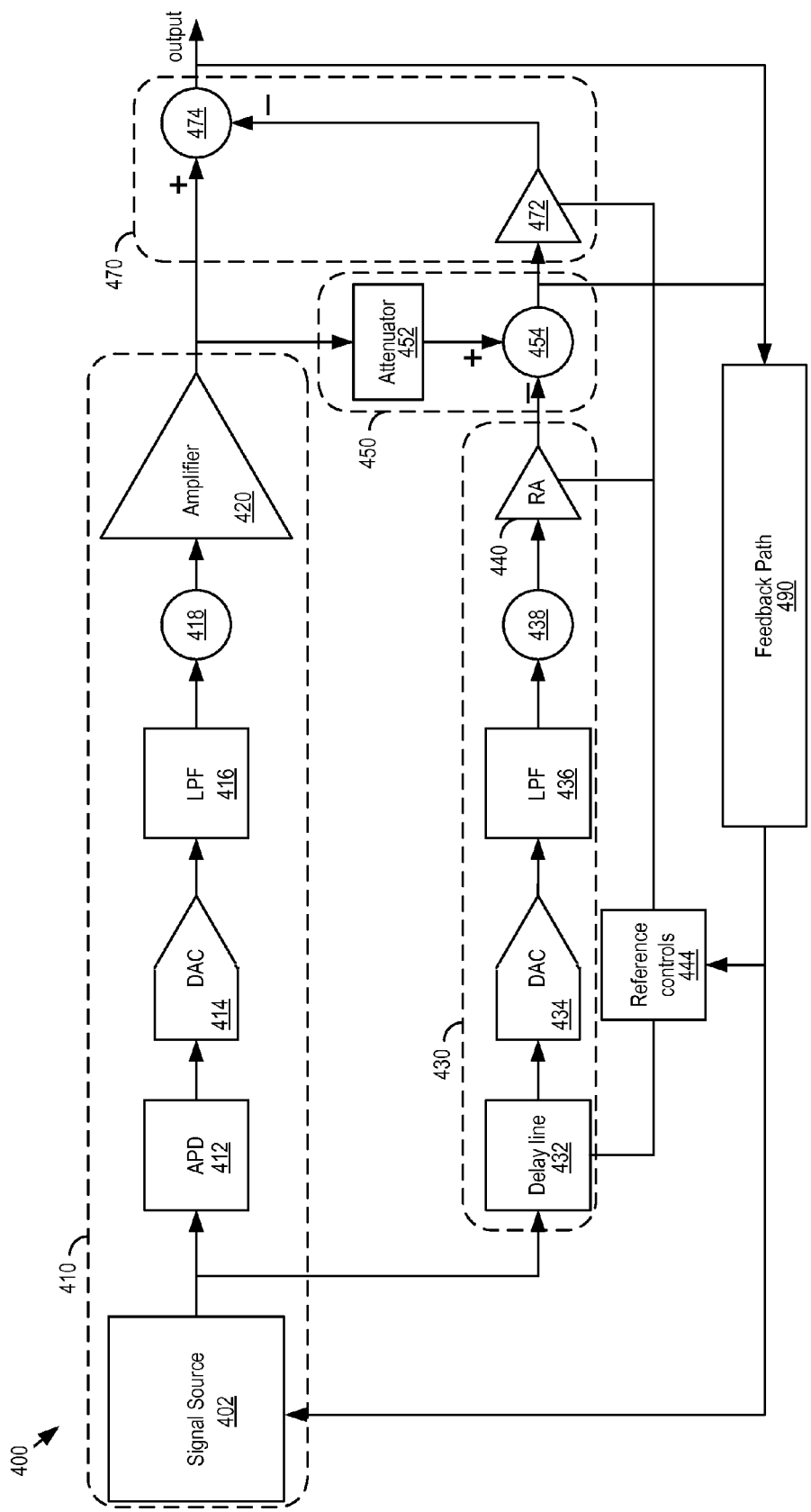
FIG. 3 shows example multiple-path noise cancellation logic (MNCL).

FIG. 3 shows example multiple-path noise cancellation logic (MNCL) 400. The UE 100 may implement the MNCL 400, as examples, in the control instructions 122 or in hardware, executable instructions (e.g., firmware) or combinations of hardware and executable instructions in the communication interface 112. The MNCL 400 may include a lead path 410, a reference path 430, and a feedback path 490. The lead path 410 and the reference path 430 may share a signal source 402. For example, the signal source 402 may include a baseband IC compliant with one or more wireless standards. The baseband IC may supply encoded packets to the MNCL 400 and that the MNCL 400 ultimately transmits. In various implementations, the input from the signal source 402 may be supplied to amplifier pre-distortion (APD) component 412 on the lead path 410.

The APD component 412 may pre-distort the signal to account for a non-linearities caused by the amplifier 420. In some implementations, the APD may be implemented to act on the signal in the digital domain for digital APD. The APD component 412 may generate a transfer function and impart it to the signal to pre-cancel non-linear contributions from the amplifier 420. In some implementations, the output of the APD component 412 may be passed to a digital-to-analog converter (DAC) 414. The DAC 414 may convert a digitally encoded signal from the signal source 402 to an analog waveform for transmission. The signal may be passed from the DAC 414 to a low-pass filter (LPF) 416.

The LPF 416, may filter spectral components at higher frequencies than the signal band. For example, out-of-band (OOB) spectral components (e.g. signals for coexisting wireless interfaces, and/or other wireless signals) may be filtered in part by the LPF 416. The signal is passed from the LPF 416 to the mixer 418. The mixer may upconvert the signal for transmission. For example, the signal may be an LTE-compliant signal and the upconversion process upconverts the signal to the band allocated for the device (e.g., the device 100) on which the MNCL 400 is disposed. In various implementations, various components, including the mixer 418, the LPF 416, the DAC 414, and/or the APD component 412 may be omitted from the lead path 410. Further, the order of these components on the lead path 410 may be different, e.g., switched.

The signal on the lead path 410 is passed to the amplifier 420. The amplifier 420 may amplify the signal and in the process of amplification the amplifier 420 may impart a distortion on the signal. In some cases, the distortion imparted by the amplifier 420 may not exactly match the distortion that the APD 412 pre-cancels. Further, in some implementations, the distortion may be dependent on the level of amplification imparted by the amplifier 420. For example, as the level of amplification increases the level of distortion may increase.

The reference path 430 may include a delay line 432, a DAC 434, a LPF 436, a mixer 438, and a reference amplifier (RA) 440. In some implementations, the DAC 434, LPF 436, and mixer 438 may be matched in type, e.g., fabrication process, operational parameters, propagation path length contribution, and/or other type matching, to the mixer 418, LPF 416, and DAC 414 disposed on the lead path 410 to simplify synchronization between the lead path 410 and the reference path 430. The delay line 432 may be adjusted such that the timing of the lead path matches that of the reference path at a first combiner 450 within a pre-determined timing threshold. The delay line 432 may be controlled by the reference controls 444.

The reference controls 444 may accept inputs from the feedback path 490. The signal from the signal source 402 passes through the delay line 432, the DAC 434, the LPF 436, and the mixer 438 to the RA 440. The level of the amplification by the RA 440 may be controlled by the reference controls 444. The reference controls 444 may include logic to set the amplification level of the reference amplifier based on the power level of the signal following an attenuator 452 in the first combiner 450.

As discussed below, the feedback path 490 may sample signals at various points to facilitate control of the RA 440. The RA 440 may amplify the signal. In some cases, the amplification by the RA 440 may be less than that by the amplifier 420. For example, the attenuator 452 may reduce the amplitude of the output of the amplifier 420. The level of amplification by the RA may be adjusted downward from the level of amplification by the amplifier 420 to account for the attenuation. Accordingly, the distortion imparted by the RA 440 may be less than that by the amplifier 420 where the distortion is dependent on the amplification level. In some implementations, the RA 440 may be more linear and have a smaller distortion profile than the amplifier 420 because the amplification specification of the RA 440 may be lower due to the attenuation after the amplifier 420.

The output of the amplifier 420, which may include the amplified signal and the imparted distortion, may be split between multiple combiners, e.g., the first combiner 450 and the second combiner 470. A first combiner 450 may include the attenuator 452 and a signal combiner (SC) 454. The input of the attenuator 452 receives one split of the amplifier 420 output. The output of the attenuator 452 is connected to a first input of the SC 454. A second input of the SC 454 is connected to the output of the RA 440. In some implementations, the SC 454 may generate a correction signal based on the difference between the signal at the output of the RA 440 and the attenuated output from the amplifier 420. For example, the SC 454 may generate the correction signal by subtractively combining the output of the RA and the attenuated output of the amplifier 420. As discussed above in some cases, the distortion imparted by the RA is less than the distortion imparted by the amplifier 420. The correction signal may reflect the distortion imparted by the amplifier 420.

The correction signal is passed to correction amplifier 472 of the second combiner 470. The correction amplifier 472 may amplify the correction signal to a level that is the inverse of the attenuation by the attenuator 452. The output of the correction amplifier 472 is provided to a SC 474. The output of the amplifier 420 may be provided to a second input of the SC 474. The SC 474 may generate an output for the MNCL 400 that is based on the difference of the amplified correction signal and the output of the amplifier 420. Note that the output of the amplifier 420 may include the amplified signal and the distortion from the amplifier 420. The MNCL 400 output may lack a portion of the distortion from the amplifier 420 because the amplified correction signal may reflect the distortion caused by the amplifier 420. In some cases, correction amplifier 472 may impart a distortion onto the correction signal.

The power level of the amplified correction signal may be similar to the power level of the distortion from the amplifier 420. In some cases, a portion of the power in the output of the amplifier 420 may be in the signal and a second portion may be in the distortion. The correction signal may reflect power in the distortion and not the power in the signal. In some cases, the power output of the correction amplifier 472 may be lower than the power output of the amplifier 420. In some cases, the reduced power output of the correction amplifier 472 may allow for a more linear amplifier to be used as the correction amplifier 472. The reduced distortion in the RA 440 and the correction amplifier 472 may allow for cancellation of a portion of the distortion imparted by the amplifier 420 in the MNCL 400 output.

In various implementations, the feedback path 490 may be connected to the output of the SC 454 and the SC 474. The feedback path may provide the sampled outputs to the reference controls 444. The reference controls 444 may include logic to match the timing of the signal on the lead path 410 to the timing of the signal on the reference path 430 during a calibration period. Additionally or alternatively, the reference controls 444 may adjust the RA to match amplify the signal on reference path 430 to match the power level of the attenuated signal from the lead path 410 during the calibration period. For example, the logic in the reference controls 444 may minimize the amplitude of the correction signal at the frequency of the signal from the signal source 402. Additionally or alternatively, the reference controls may attempt to minimize the integrated power of the correction signal. For example, in some cases, the minimum integrated power for the correction signal may correspond to matching in amplitude and/or timing on the lead 410 and reference 430 paths.

In various implementations, during the calibration period the signal source 402 may provide a calibration signal to the lead 410 and reference 430 paths. The calibration signal may be a random content transmission (e.g., a random/pseudo-random data sequence, or other random content transmission). The calibration signal may be a transmission with pre-determined characteristics (e.g., a table sequence, set pseudo-random sequence, series of known commands, a signal that cycles through feasible (e.g., standards compliant) bandwidth and power settings, or other predetermined signal type). For example, a WIFI signal that may vary in bandwidth, e.g. 5 MHz, 10 MHz, 20 MHz may be used as a calibration signal. In some cases, a calibration period (or portion thereof) may be used for the possible bandwidths. Additionally or alternatively, a parameter of the calibration signal may not be determined a priori. For example, in the WIFI example, a power level of the transmission may not be indicated within the transmission. In some cases, this may ensure robustness in the handling of arbitrary signals. Further, to avoid interference with other systems the calibration transmission may be compliant with the transmission protocol(s) of the MNCL 400. For example, during the calibration period the signal source may provide a protocol-complaint request (e.g. a request to transmit data). The signal source may then provide data for the purposes of the calibration period. The data may include data scheduled to be sent by the signal source 402, random data, and/or predetermined data sequences.

In various implementations, one or more input tones may be provided to the system. The reference controls 444 may base the calibration on a minimization of an output tone with a different frequency of that of the input tones. The output tone may be generated via noise or interference sources within the lead path 410. For example, two tones may be input into the system and the reference controls may be tuned to minimize an IM3 or IM5 tone resulting from inter-mixing between the two input tones.

In some implementations, the calibration may be performed independently of the signal source 402. For example, the signal source 402 may provide normally scheduled signal transmissions. The reference controls 444 may base the calibration on transmissions that incidentally occur from the signal source 402.

In some implementations, calibration may occur at multiple intervals. The intervals may occur, e.g., periodically, on demand, via noise level triggers, if a reduction in noise cancellation is detected, at process voltage temperature (PVT) corners, at power-on/wake-up/sleep, or other intervals. The calibrations may thereby facilitate accounting for changing conditions.

In various implementations, a calibration period may be tens of microseconds to a few milliseconds in duration. Successive calibration periods may occur hundreds of milliseconds apart and/or seconds, hours, or greater intervals, apart. As discussed above the intervals separating calibration periods may be determined depending on the parameters or components of the system.

In some implementations, the efficacy of noise cancellation may be dependent on the accuracy of timing and amplitude tracking. Table 1 shows example noise cancellation levels for various timing and amplifier gain errors.

TABLE 1

Example noise cancellation for gain and phase errors

| Gain Error (dB) | Phase Error | Noise Cancellation (dB) |
|---|---|---|
| 1 | 0 | −19 |
| 0.5 | 0 | −25 |
| 0.25 | 0 | −31 |
| 0.1 | 0 | −39 |
| 0.01 | 0 | −59 |
| 0 | 10° | −15 |
| 0 | 5° | −21 |
| 0 | 2.5° | −27 |
| 0 | 1° | −35 |
| 0 | 0.1° | −55 |

Figure 4:
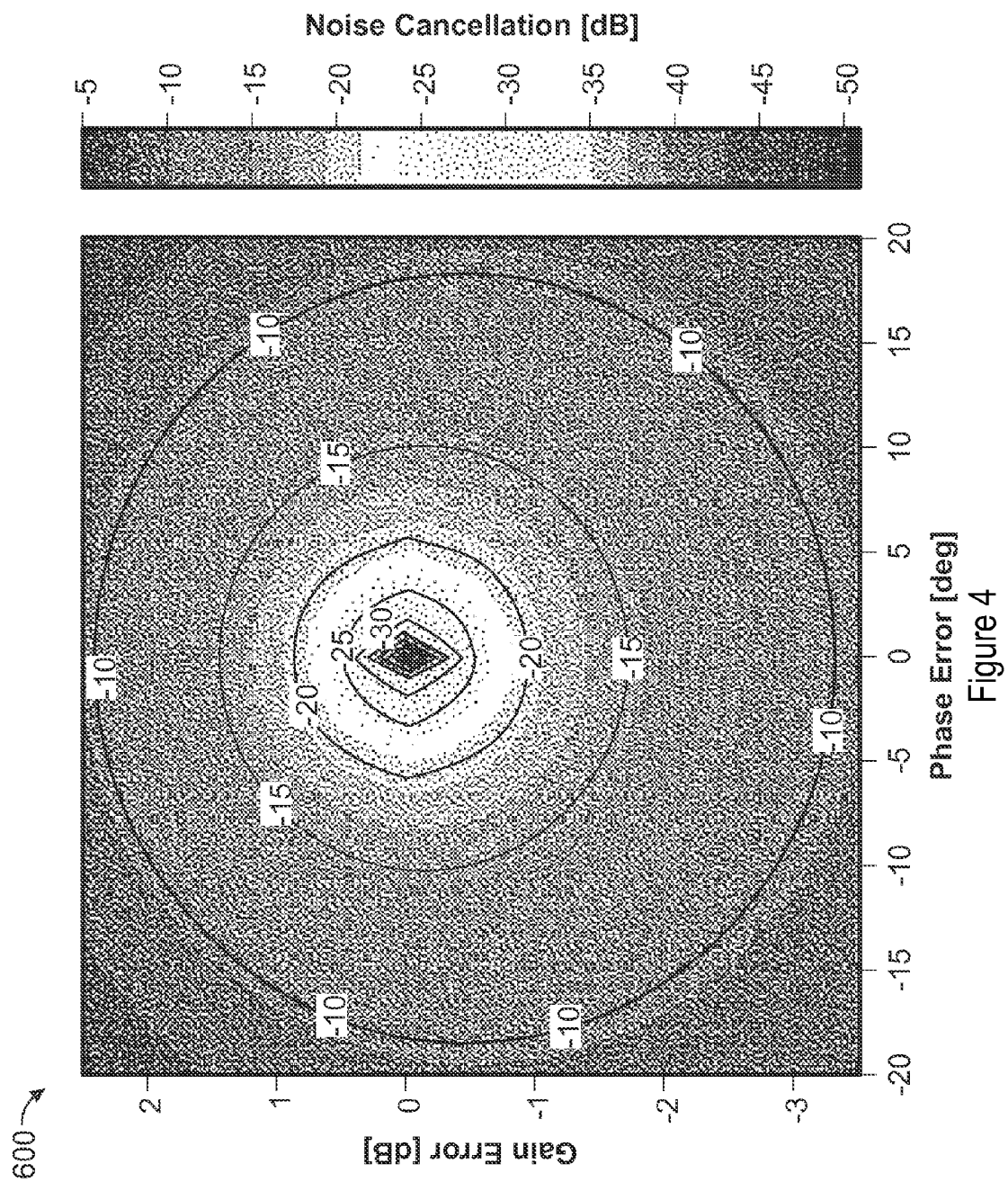
FIG. 4 shows example noise cancellation.

In some cases, lower errors in gain and/or phase tracking may allow for increased noise cancellation. FIG. 4 shows example noise cancellation 600. Example noise cancellation levels are shown for various gain and phase tracking errors in a contour plot.

Figure 5:
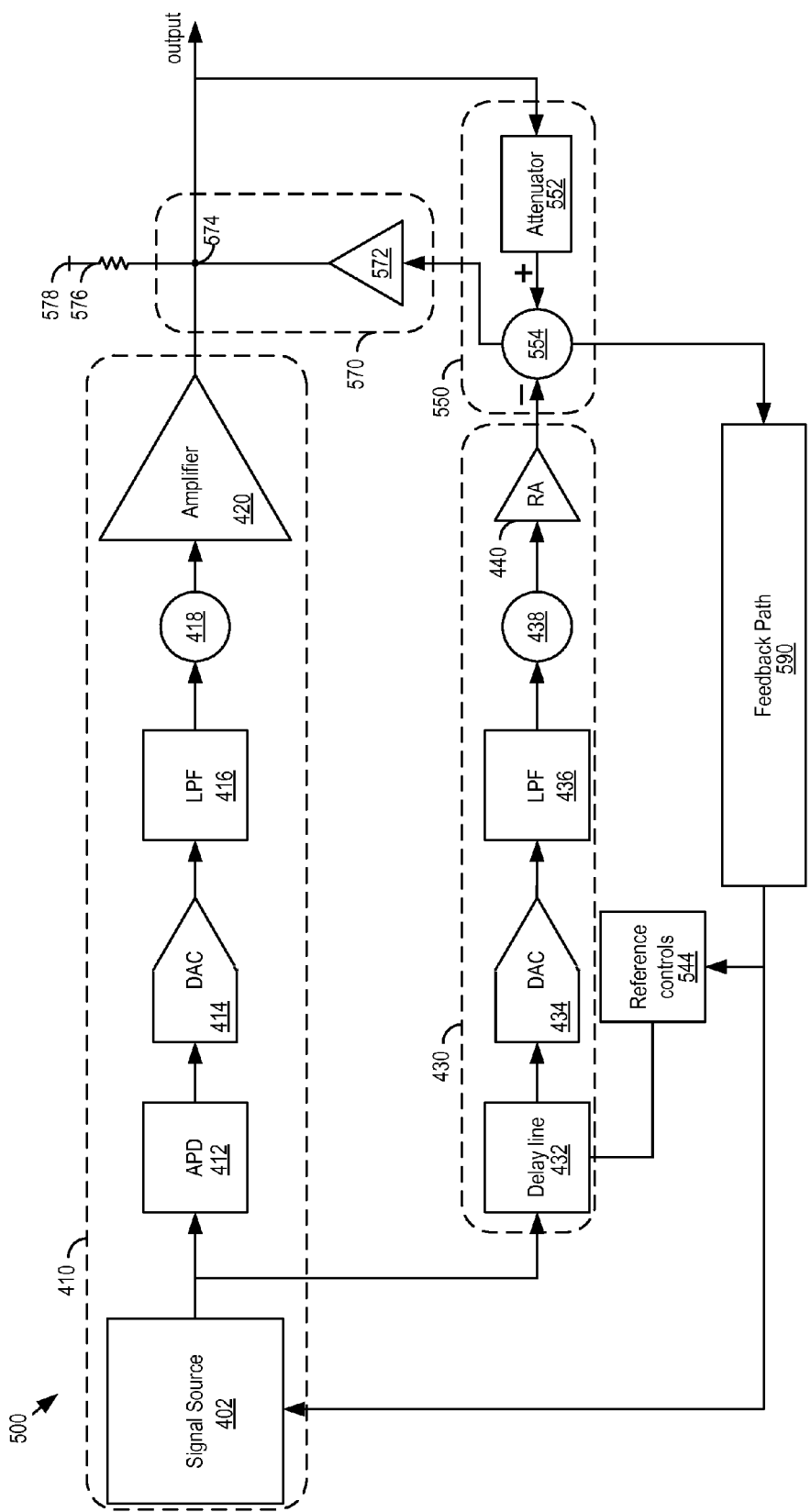
FIG. 5 shows an example MNCL.
Figure 6:
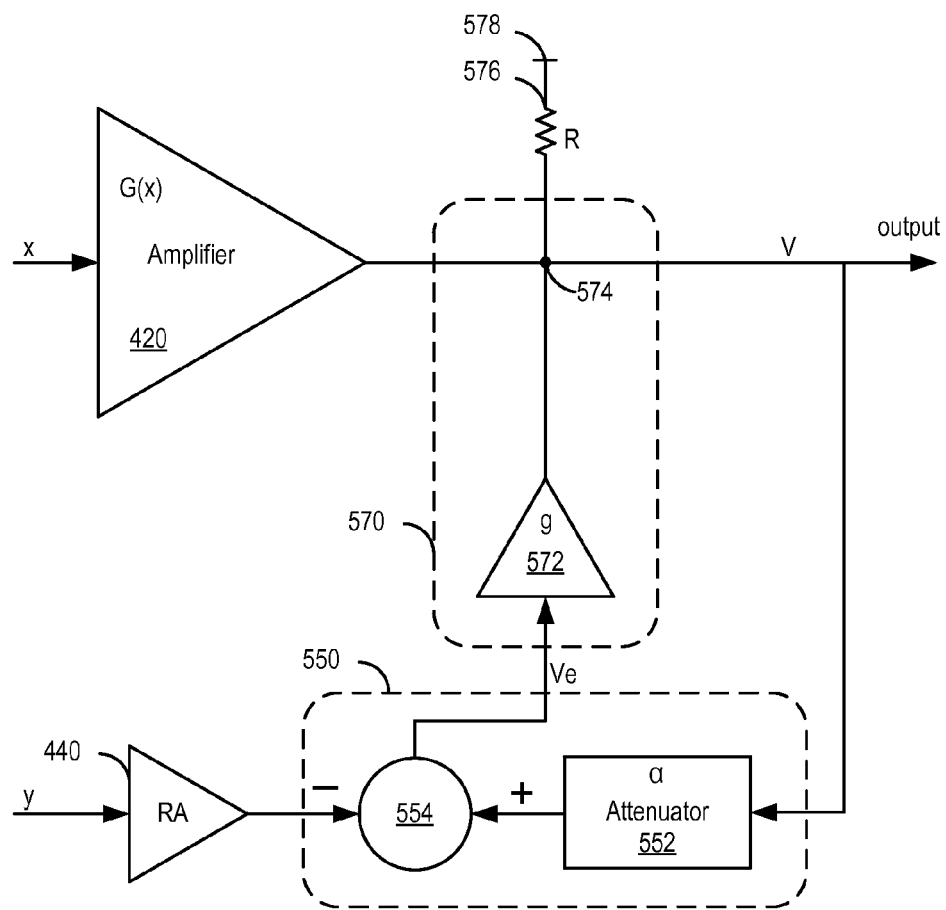
FIG. 6 shows example loop gain of the example MNCL of FIG. 5.

FIG. 5 shows an example MNCL 500. The MNCL 500 may include a lead path 410, a reference path 430, and a feedback path 590. The MNCL 500 may include a first combiner 550 and a second combiner 570. The first combiner 550 may receive a portion of the output of the MNCL 500 at an attenuator 552. A SC 554 of the first combiner 550 may accept the output of the attenuator 552 at a first input and may accept the output of the RA 440 at a second input. The SC 554 may combine the attenuated MNCL 500 output and the RA 440 output to generate a correction signal based on the difference between the two outputs.

The correction signal may be provided to a transconductance circuit 572 of the second combiner 570. The output of the transconductance circuit 572 and the output of the amplifier 420 are combined at the second SC 574 to generate the output of the MNCL 500. In some implementations, the second SC 574 may be an electrical connection, e.g. a short, to hold the voltage at the output of the amplifier 420 at the voltage of the output of the system. In the example MNCL 500 the output of the MNCL 500 is applied in the recursive feedback loop via the first 550 and second 570 combiners. The correction signal may experience loop gain via the transconductance circuit 572. The gain experienced by the correction signal may drive the attenuated output of the MNCL 500 to approach the output of the RA 440.

In some cases, driving the attenuated output of the MNCL 500 to approach the output of the RA 440 may correspond to the distortion of the amplifier 420 being cancelled from output of the MNCL 500. Further, as the attenuated output of the MNCL 500 approaches the output of the RA 440, the correction signal may be minimized, e.g. driven to zero or low amplitude. The gain of the transconductance circuit may be facilitated by the load resistor 576 and the power supply 578. The load resistor 576 may operate to convert the current generated by the transconductance circuit 572 to a power. The power supply 578 provides a current source at constant voltage for the transconductance circuit 572 to draw from for the loop gain.

The feedback path 590 may provide feedback from the output of the SC 554 to adjust the delay line 432 timing. The reference controls 544 may accept the feedback and control the timing of the delay line 432. In some implementations, the reference controls 544 may not control the gain of the RA 440 and/or the loop gain of the transconductance circuit 572. The amplification level of the RA 440 may be fixed based on the attenuator 552. The loop gain may also be fixed based on the power supply 578 and load resistor 576. In some implementations, the delay line 432 timing may be adjusted by the reference controls 544 to minimize the power of the correction signal.

Figure 9:
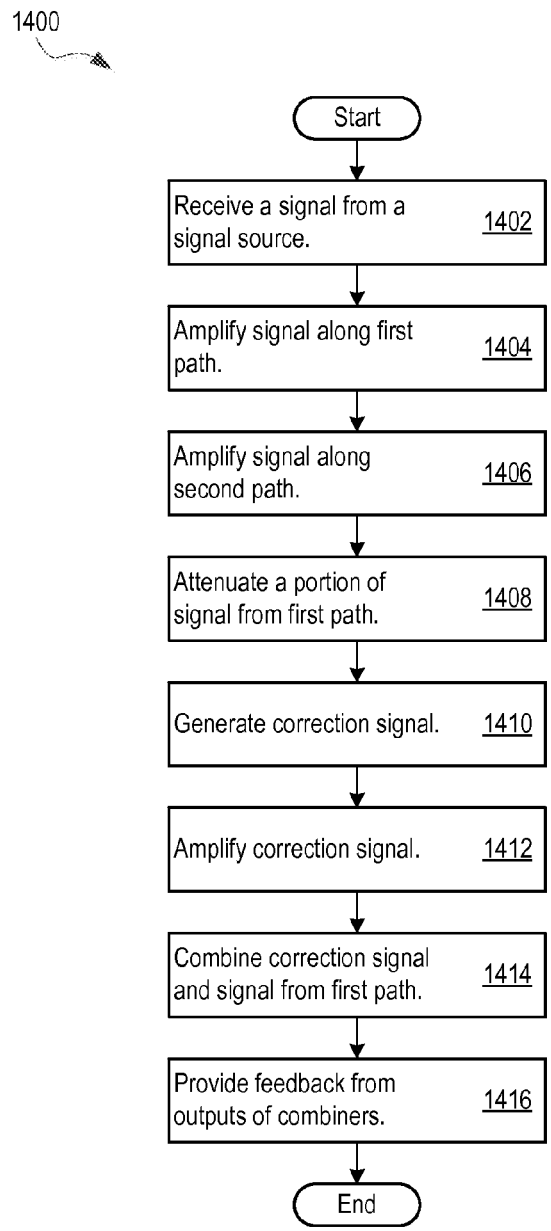
FIG. 9 shows example logic for noise cancellation.

FIG. 9 shows example loop gain of the example MNCL 500. The output power V of the MNCL may be represented as:

$$V = (G(x) - g \cdot Ve)R \qquad \text{Equation 1}$$

Where G(x) is the output of the amplifier 420, x is the input to amplifier 420, g is the transconductance of the transconductance circuit 572, R is the resistance of the load resistor 576, and Ve is the correction signal which may be expressed as:

$$Ve = \frac{1}{\alpha}V - y \qquad \text{Equation 2}$$

Where the attenuation of attenuator 552 is proportional to α and y is the output of the RA 440. G(x), the output of amplifier 420, may be represented as a linear portion and a nonlinear portion via a first order Taylor expansion:

$$G(x) = g1 \cdot x + g3 \cdot x^3 + g5 \cdot x^5$$

$$G(x) = g1 \cdot x + G'(x) \qquad \text{Equation 3}$$

Where g1 is the linear coefficient of G(x) and G'(x) is the nonlinear portion of G(x), e.g. terms of order $x^2$ and above. Applying Equations 2 and 3 to 1 yields:

$$V = \left(g1 \cdot x + G'(x) - \left(\frac{V}{\alpha} - y\right)g\right)R \qquad \text{Equation 4}$$

Which yields:

$$V = \frac{g1 \cdot R \cdot x + g \cdot R \cdot y}{1 + \frac{g \cdot R}{\alpha}} + \frac{G'(x) \cdot R}{1 + \frac{g \cdot R}{\alpha}} \quad \text{Equation 5}$$

If y, the output of RA 440, is assumed to have low distortion, then x can be treated as a linear function of y. In this case, the first term of V in Equation 5 can be treated as a linear function of y and/or a linear function of x. In order for Ve to be driven to zero amplitude, G'(x) may be removed from V because the y does not include nonlinear terms of x. In some implementations, this assumption may be made independently of the level of distortion in y, e.g. y may be assumed to have low distortion if it has none, low, or high distortion. Distortion present in G(x) and y may not be removed from V. Distortion present in y and not in G(x) may be present in V.

Figure 7:
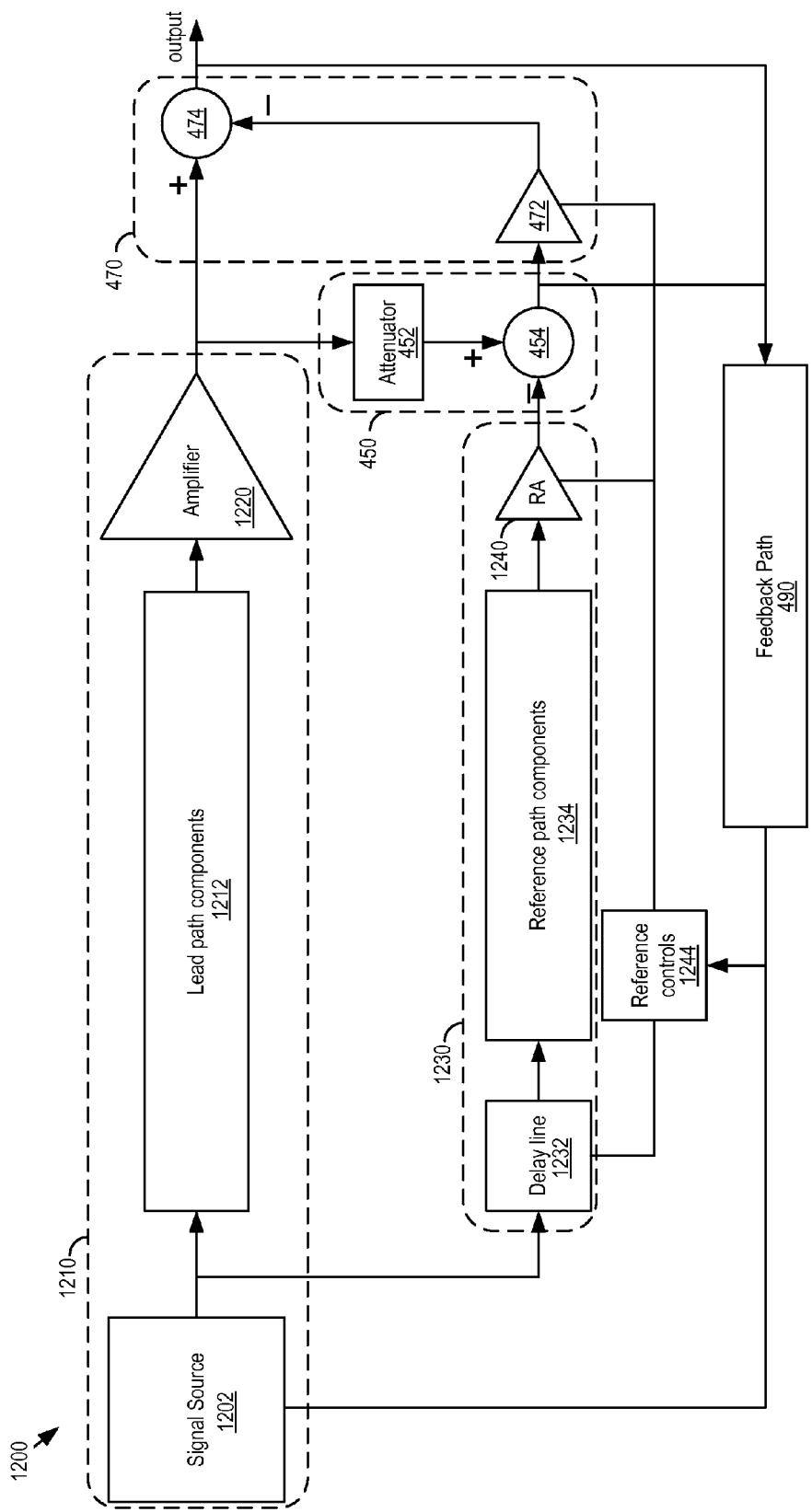
FIG. 7 shows an example MNCL.

FIG. 7 shows an example MNCL 1200. The example MNCL has a lead path 1210, a reference path 1230, and a feedback path 490. The lead path 1210 includes lead path components 1212, which may perform signal processing, transmission and/or manipulation functions on a signal propagating along the lead path 1210. The lead path may further include an amplifier 1220. The reference path 1230 includes reference path components 1234, which may perform signal processing, transmission and/or manipulation functions on a signal propagating along the reference path 1230. The lead path may further include a delay line 1232 and a RA 1240. The MNCL 1200 may include combiners 450 and 470, which operate to cancel distortion imparted by the amplifier 1220 based on the signal from the RA 1240. Feedback path 490 may provide feedback from the outputs of combiners 450 and 470 and/or from other points past amplifier 1220 and RA 1240. Feedback path 490 provides feedback to reference controls 1244 which may configure the delay line 1232 the RA 1240, and the correction amplifier 472. The signal source 1202 may be virtually any source. For example, the signal source may include a Tx source such as a baseband IC, or a Rx source, such as an antenna. The lead path components 1212 and the reference path components 1234 may vary in function depending on whether the MNCL is in a Rx or Tx configuration. The amplifier 1220 type may be dependent on whether the MNCL is in a Rx or Tx configuration. For example, an integrated low noise amplifier (iLNA) may be used in an Rx configuration and an iPA may be used in a Tx configuration. The signal source may receive or provide feedback depending on the operation of the system. For example, a TX source may be provided feedback by the feedback path 490 to allow for adjustment based on measured parameters. An Rx signal source, such as an antenna, may be sampled for feedback to allow the MNCL 1200 to adjust settings in response to changing conditions. Additionally or alternatively, Rx sources may receive feedback and Tx sources may provide feedback.

Additionally or alternatively, the reference controls 1244 of a Rx implementation may be tuned to remove out-of-band noise and interference. For example, in band components may represent received signal and may not be removed. Out-of-band components may represent distortion components resulting from the amplifier 1220 and/or other interference and/or noise sources.

Figure 8:
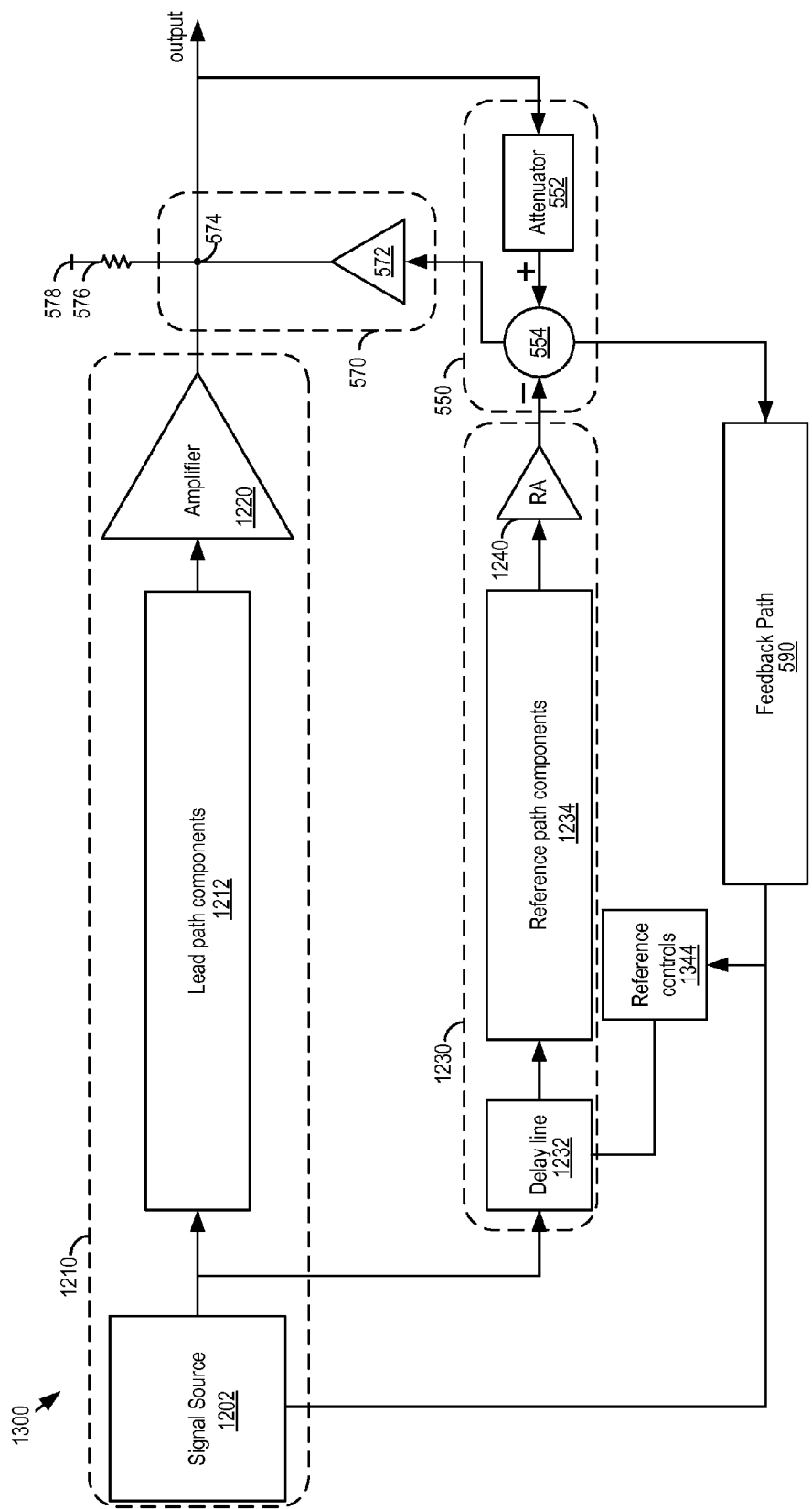
FIG. 8 shows an example MNCL.

FIG. 8 shows an example MNCL 1300. The example MNCL has a lead path 1210, a reference path 1230, and a feedback path 590. The lead path 1210 includes lead path components 1212. The lead path may further include an amplifier 1220. The reference path 1230 includes reference path components 1234. The lead path may further include a delay line 1232 and a RA 1240. The MNCL 1300 may include combiners 550 and 570, which operate to cancel distortion imparted by the amplifier 1220 based on the signal from the RA 1240. Feedback path 590 may provide feedback from the output of combiner 550 and/or from other points past amplifier 1220 and RA 1240. Feedback path 590 provides feedback to reference controls 1344 which may configure the delay line 1232. The signal source 1202 may be virtually any source. For example, the signal source may include a Tx source such as a baseband IC, or a Rx source, such as an antenna. The signal source may receive or provide feedback depending on the operation of the system. For example, a TX source may be provided feedback by the feedback path 590 to allow for adjustment based on measured parameters. An Rx signal source, such as an antenna, may be sampled for feedback to allow the MNCL 1300 to adjust settings in response to changing conditions. Additionally or alternatively, Rx sources may receive feedback and Tx sources may provide feedback.

FIG. 9 shows example logic 1400 for noise cancellation. The logic 1400 may receive a signal from a signal source (1402). For example, the signal source may include an antenna and the signal may include a data packet received from a remote transmitting device. In a second example, the signal source may produce a TX signal for output to an antenna. The logic 1400 may provide the received signal to a first path and a second path. For example, the logic 1400 may provide the signal to a lead path, e.g. 410 and 1210, and to a reference path, e.g. 430 and 1230. The signal may be amplified along the first path (1404). For example, the signal may be amplified by an amplifier, e.g. 420, 1220. The amplification along the first path may impart a first distortion onto the signal. The signal may be amplifier along the second path (1406). For example, the signal may be amplified by a RA, e.g. 440, 1240. The amplification along the second path may impart a second distortion onto the signal. The second distortion may be smaller than the first distortion. A portion of the signal from the first path may be attenuated (1408). The attenuated signal portion from the first path may be combined with the signal from the second path to generate a correction signal based on the difference between the first and second distortions (1410). For example, the first combiner, e.g. 450, 550, may be used to combine the signals. In some cases, the correction signal may be amplified (1412). For example, the amplification may be performed by the correction amplifier 472 or the transconductance circuit 572. The amplification of the correction signal may be based on the level of attenuation of the portion of the first signal. The logic 1400 may combine the correction signal and a second portion of the first signal to generate an output (1414). For example, the correction signal and first signal may be combined at the second combiner 470, 570. The logic 1400 may provide feedback from the outputs of the signal combiners for calibration (1416). In various implementations, the feedback may be used by the logic 1400 to calibrate a delay line of the second path, the amplification level of the second signal, and/or the amplification level of the correction signal.

The methods, devices, and logic described above may be implemented in many different ways in many different combinations of hardware, software or hardware and software. For example, all or parts of the system may include circuitry in a controller, a microprocessor, or an ASIC, or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various implementations have been described, it will be apparent to those of ordinary skill in the art that many more embodiments and implementations are possible within the scope of the disclosure.

What is claimed is:

1. A device, comprising:
a first path configured to receive an input signal, the first path comprising a first amplifier, the first path configured to produce a first signal based on the input signal and a first distortion imparted by the first amplifier;
a second path configured to receive the input signal, the second path comprising a second amplifier, the second path configured to produce a second signal based on the input signal and a second distortion imparted by the second amplifier;
a first combiner connected to the first and second paths, the first combiner configured to combine the first and second signals to produce a correction signal based on a difference between the first and second distortion; and
a second combiner connected to the first path and the first combiner, the second combiner configured to combine the first signal and the correction signal to generate an output signal.

2. The device of the claim 1, where the first combiner is further configured to attenuate the first signal prior to combination with the second signal.

3. The device of claim 2, where the second amplifier is configured to amplify the second signal based on an attenuation level of the first signal.

4. The device of claim 3, where the first combiner is connected to a feedback path, the feedback path configured to:
calibrate the second amplifier based on the attenuation level of the first signal; and
calibrate a delay element, the delay element configured to synchronize the first and second signals.

5. The device of claim 2, where the first combiner is configured to subtractively combine the second signal with the attenuated first signal.

6. The device of claim 2, where the second combiner comprises a third amplifier configured to, prior to combination with the first signal, amplify the correction signal based on an attenuation level of the first signal.

7. The device of claim 6, where the second combiner is connected to a feedback path, the feedback path configured to calibrate the third amplifier.

8. The device of claim 6, where the second combiner is configured to subtractively combine the amplified correction signal with the first signal.

9. The device of claim 1, where a first amplification level of the first amplifier is greater than a second amplification level of the second amplifier.

10. The device of claim 1, where:
the first path further comprises a distortion source that imparts a third distortion to the first signal; and
the second combiner is configured to remove an effect of the third distortion from the output signal.

11. The device of claim 1, where:
the correction signal comprises an error signal between the output signal and the second signal; and
the second combiner comprises a transconductance circuit configured to attempt to reduce an amplitude of the error signal.

12. A method, comprising:
receiving an input signal from a source;
providing the input signal to a first path and a second path;
amplifying, at a first amplification level, along the first path to produce a first signal, the first signal characterized by a first distortion;
amplifying, at a second amplification level, along the second path to produce a second signal characterized by a second distortion, the first amplification level being greater than the second amplification level;
combining the first signal and the second signal to produce a correction signal based on a difference between the first and second distortions; and
attempting to cancel the difference by combining the first signal and the correction signal to produce an output signal.

13. The method of claim 12, further comprising attenuating the first signal prior to combining the first and second signals.

14. The method of claim 13, further comprising amplifying, at a third amplification level, the correction signal prior to combining the first signal and the correction signal.

15. The method of claim 14, further comprising calibrating the second and third amplification levels based on the attenuation of the first signal.

16. The method of claim 15, where the calibrating comprises:
generating a first feedback signal based on the correction signal; and
generating a second feedback signal based on the output signal.

17. The method of claim 12, where combining the first signal and the second signal comprises combining the output signal and the second signal to generate an error signal.

18. The method of claim 17, further comprising driving a reduction in an amplitude of the error signal.

19. A device, comprising:
baseband circuitry configured to produce a first copy and a second copy of an input packet;
a first path connected to the baseband circuitry, the first path configured to receive the first copy, the first path comprising:
a first digital-to-analog converter (DAC) configured to convert the first copy to a first analog input; and
a first amplifier characterized by a first distortion, the first amplifier configured to amplify, at a first amplification level, the first analog input to produce a first signal imparted with the first distortion;

a second path connected to the baseband circuitry, the second path configured to receive the second copy, the second path comprising:

a second DAC configured to convert the second copy to a second analog input; and a second amplifier characterized by a second distortion, the second amplifier configured to amplify, at a second amplification level less than the first amplification level, the second analog input to produce a second signal imparted with the second distortion;

a first combiner connected to the first and second paths, the first combiner configured to:

attenuate, at an attenuation level, the first signal from the first path; and combine the attenuated first signal and the second signal to produce a correction signal; and a second combiner connected to the first path and the first combiner, the second combiner configured to:

amplify, at a third amplification level, the correction signal from the first combiner, the third amplification level based on the attenuation level; and combine the first signal and the amplified correction signal to generate an output signal.

20. The device of claim 19, further comprising a feedback path configured to generate a feedback signal; and where the second path further comprises a delay line configured to:

accept the feedback signal; and synchronize the attenuated first signal and the second signal.

* * * * *